US012660281B2

(12) United States Patent (10) Patent No.: US 12,660,281 B2

Frougier et al. (45) Date of Patent: Jun. 16, 2026

(54) SELF-ALIGNED GATE JUMPER CONNECTING ADJACENT GATES

(71) Applicant: International Business Machines Corporation, Armonk, NY (US)

(72) Inventors: Julien Frougier, Albany, NY (US); Ruilong Xie, Niskayuna, NY (US); Min Gyu Sung, Latham, NY (US); Heng Wu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 542 days.

(21) Appl. No.: 17/807,246

(22) Filed: Jun. 16, 2022

(65) Prior Publication Data

US 2023/0411473 A1 Dec. 21, 2023

(51) Int. Cl.
| | |
|---|---|
| *H10D 64/23* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2026.01) |
| *H10D 84/03* | (2025.01) |

(52) U.S. Cl.
CPC ......... *H10D 64/259* (2025.01); *H10D 30/014* (2025.01); *H10D 30/43* (2025.01); *H10D 30/6713* (2025.01); *H10D 30/6757* (2025.01); *H10D 62/121* (2025.01); *H10D 84/0128* (2025.01); *H10D 84/013* (2025.01); *H10D 84/038* (2025.01)

(58) Field of Classification Search
CPC .. H10D 64/259; H10D 64/258; H10D 30/014; H10D 30/43; H10D 30/6713; H10D 30/6757; H10D 30/6735; H10D 62/121; H10D 84/0128; H10D 84/013; H10D 84/038; H10D 84/0149; H10D 84/83; B82Y 10/00
See application file for complete search history.

(56) References Cited

U.S. PATENT DOCUMENTS

| | | | |
|---|---|---|---|
| 9,786,660 | B1 | 10/2017 | Farrell |
| 9,929,048 | B1 | 3/2018 | Xie |
| 9,941,278 | B2 | 4/2018 | Labonte |
| 10,002,932 | B2 | 6/2018 | Xie |
| 10,403,547 | B2 | 9/2019 | Sung |
| 10,446,653 | B2 | 10/2019 | Xie |

(Continued)

*Primary Examiner* — William B Partridge
*Assistant Examiner* — Chevy J Boegel
(74) *Attorney, Agent, or Firm* — Aaron N. Pontikos

(57) ABSTRACT

An approach that provides a method for forming a semiconductor structure with a gate jumper. The semiconductor structure includes a source/drain contact for a semiconductor device and a dielectric cap on a top portion of the source/drain contact. The semiconductor structure includes two gates adjacent to the source/drain contact. The semiconductor structure includes a gate jumper that connects the two gates adjacent to the source/drain contact. The gate jumper surrounds the dielectric cap on the top portion of the source/drain contact. In other embodiments, the gate jumper is over two or more dielectric caps on two or more source/drain contacts and the gate jumper connects three or more adjacent gates that surround a bottom portion of each of the two or more source/drain contacts.

20 Claims, 17 Drawing Sheets

(56)     References Cited

U.S. PATENT DOCUMENTS

| 10,529,624 | B2 | 1/2020 | Leobandung | |
| 10,665,692 | B2 | 5/2020 | Xie | |
| 10,770,388 | B2 | 9/2020 | Xie | |
| 10,832,964 | B1 | 11/2020 | Xie | |
| 11,004,750 | B2 | 5/2021 | Xie | |
| 2014/0077305 | A1 | 3/2014 | Pethe | |
| 2019/0326300 | A1* | 10/2019 | Liaw | H10D 62/292 |
| 2019/0348509 | A1 | 11/2019 | Sung | |
| 2019/0385946 | A1* | 12/2019 | Xie | H01L 23/535 |
| 2020/0075595 | A1* | 3/2020 | Shin | H01L 21/76897 |
| 2021/0020644 | A1* | 1/2021 | Paul | H01L 21/28088 |

* cited by examiner

500B

81

51

30

81

51

30

10

8

4

3

10

8

4

3

10

8

2

SELF-ALIGNED GATE JUMPER CONNECTING ADJACENT GATES

BACKGROUND OF THE INVENTION

The present invention relates generally to the field of semiconductor device formation and particularly to the formation of a conductive jumper between two gates in a semiconductor device.

Semiconductor device fabrication is a series of processes used to create integrated circuits present in electronic devices. As semiconductor device scaling continues, in accordance with Moore's Law, and electrical performance requirements of semiconductor chips continue to advance, the need for smaller and more complex semiconductor circuit features and interconnections drive advances in semiconductor device processing and manufacture. With smaller and smaller feature sizes for various semiconductor device features, the connections and contacts between the reduced size semiconductor device features also face challenges with smaller spaces between adjacent connections and in an increased number of connections between the semiconductor features.

SUMMARY

Embodiments of the present invention disclose a semiconductor structure that includes a source/drain contact for a semiconductor device and a dielectric cap on a top portion of the source/drain contact. The semiconductor structure includes two gates adjacent to the source/drain contact. The semiconductor structure includes a gate jumper that connects the two gates adjacent to the source/drain contact. The gate jumper surrounds the dielectric cap on the top portion of the source/drain contact. In other embodiments, the gate jumper is over two or more dielectric caps on two or more source/drain contacts and the gate jumper connects three or more adjacent gates that surround a bottom portion of each of the two or more source/drain contacts.

Embodiments of the present invention provide a method of forming a gate jumper in a semiconductor structure. The method includes depositing a first layer of an interlayer dielectric on a plurality of gate structures and a plurality of source/drains in a portion of a semiconductor structure. The method includes patterning and etching the first layer of the interlayer dielectric above each of the plurality of source/drains. The method includes depositing and planarizing source/drain metal to form a source/drain contact on each of the plurality of source/drains. The method includes selectively recessing portions of the first layer of the interlayer dielectric between each of a plurality of source/drain contacts on the plurality of source/drains. The method includes selectively forming a dielectric cap on exposed portions of each of the plurality of source/drain contacts. The method includes depositing and planarizing a second layer of the interlayer dielectric on each of the dielectric caps and the first interlayer dielectric. The method includes forming holes in the first layer of interlayer dielectric and the second layer of interlayer dielectric for one or more gate contacts and one or more gate jumpers on one or more gate structures of the plurality of gate structures using a self-aligning, isotropic etching process. The holes or openings for the one or more gate jumpers are etched over at least one dielectric cap on one source/drain contact of the plurality of source/drain contacts and at least two adjacent gates of the nanosheet transistor. The method includes forming one or more of the gate contacts and gate jumpers by contact metal deposition and planarization. Furthermore, the method includes forming a plurality of vias where each via contacts one of the gate contacts and a gate jumper.

BRIEF DESCRIPTION OF THE DRAWINGS

The above aspects, other aspects, features, and advantages of various embodiments of the present invention will be more apparent from the following description taken in conjunction with the accompanying drawings.

DETAILED DESCRIPTION

Figure 1A:
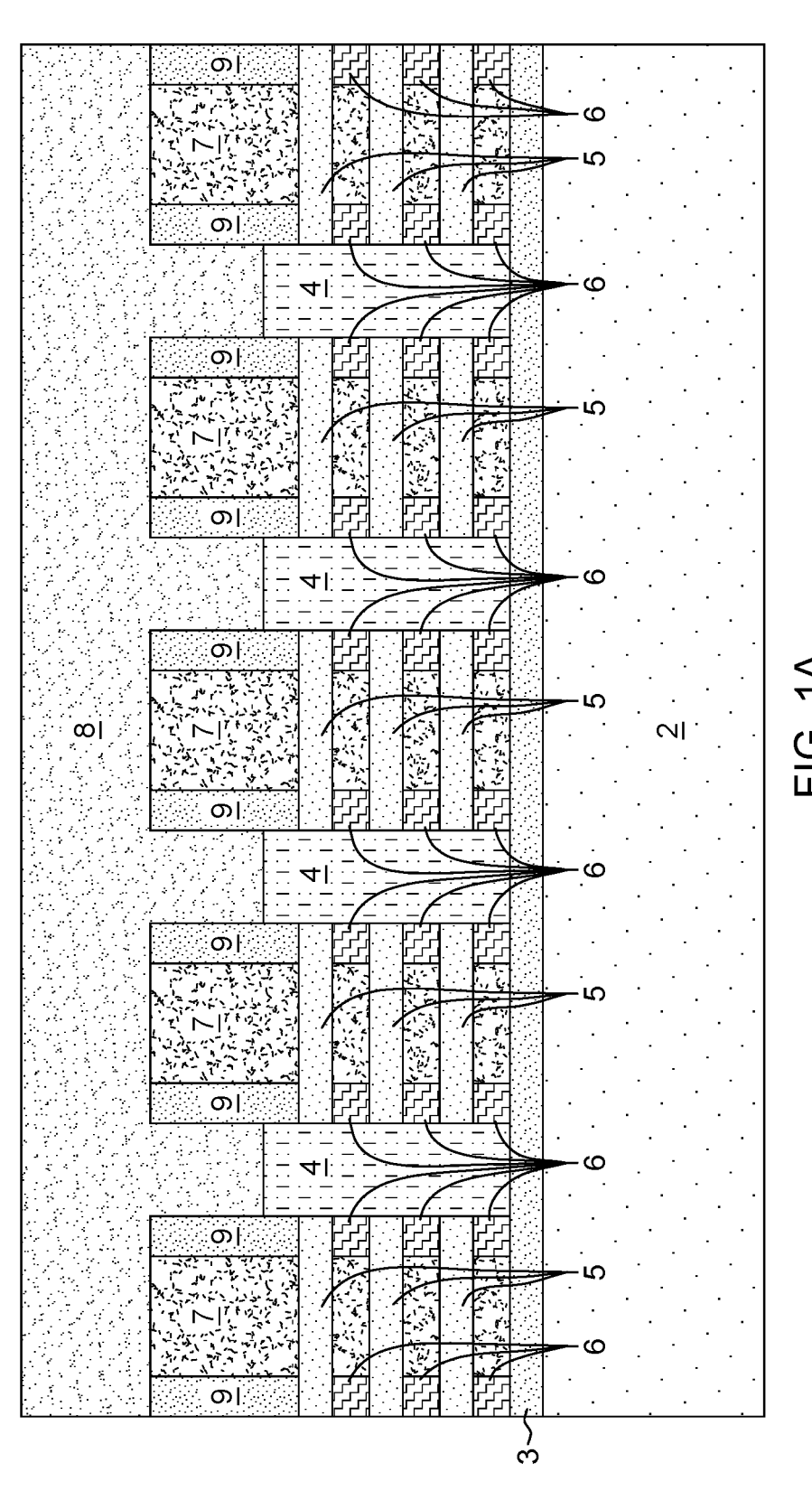
FIG. 1A depicts a cross-sectional view of a semiconductor structure across the gates of a portion of a nanosheet transistor, in accordance with an embodiment of the present invention.

Embodiments of the present invention provide a semiconductor structure with a gate jumper around and on a dielectric cap that is on a top portion of the source/drain residing between the adjacent gates connected by the gate jumper. The gate jumper provides a single gate contact that bridges or joins at least two adjacent gates by extending over the dielectric cap on the source/drain contact residing between the adjacent gates connected by the gate jumper.

Embodiments of the present invention provide a single via that connects the adjacent gates bridged by the gate jumper to the next metal layer in the semiconductor structure. The semiconductor structure using one or more gate jumpers can reduce the number of vias needed in the semiconductor structure to connect the gates to the next level of metal in the back end of the line wiring or middle of the line wiring of the semiconductor structure. Providing a gate jumper joining two, three, or more adjacent gates and connecting by a single via to the next level of metal in the semiconductor structure rather than forming two or more vias where each via connects to a single gate of the adjacent gates without the gate jumper reduces the number of vias needed to connect gates to the next metal level of the semiconductor structure.

Additionally, embodiments of the present invention disclose the gate jumper that can propagate signals in an adjacent gate. For example, when a contact via cannot be formed in an adjacent gate region due to routing congestion above the adjacent gate, then using the gate jumper, the signal on one gate can be re-routed to the second gate under the routing congestion. Embodiments of the present invention provide a gate jumper propagating a signal path from one gate to another connected gate in a congested area when a contact via cannot be formed to the second gate.

Embodiments of the present invention include one or more gate jumpers where each of the gate jumpers surrounds a dielectric cap on a source/drain contact. The dielectric cap provides electrical isolation between the gate jumper and the source/drain contact residing below the gate jumper. Additionally, the dielectric caps on the source/drain contacts prevent electrical shorting of each of the source/drain contacts covered by the dielectric cap to any adjacent gate jumper or adjacent gate contact.

While embodiments of the present invention specifically discuss a semiconductor structure for a nanosheet transistor with one or more gate jumpers formed over a dielectric cap on a source/drain, the methods disclosed to form the gate jumpers can be applied to other types of semiconductor devices (e.g., memory devices or other types of logic devices, such as fin field-effect transistors, planar field-effect transistors, etc.). Additionally, the method disclosed in the present invention provides a gate jumper that can bridge or connect multiple adjacent gates that are each separated by a source/drain contact with the top portion of the source/drain contact covered by a dielectric cap.

Embodiments of the present invention disclose a method of forming gate jumpers connecting at least two adjacent gates where each gate jumper is formed over and around the dielectric cap on each source/drain contact residing between the adjacent gates connected by the gate jumper. Embodiments of the present invention include selectively forming or selectively depositing the dielectric cap on the exposed portions of each of the source/drain contacts after recessing the interlayer dielectric material surrounding the source/drain contacts. The method includes using middle of the line and/or back end of the line semiconductor processing to form the gate jumpers.

The method includes receiving a semiconductor structure for a nanosheet transistor with nanosheets formed and sacrificial nanosheet layers removed, and the gates formed (e.g., high-k metal gate structures) and then, depositing and planarizing a layer of interlayer dielectric (ILD) on the received semiconductor structure. The method for forming the gate jumpers includes forming the source/drain contacts by recessing the deposited ILD to expose the top portions of each of the source/drain contacts. The method includes selectively forming a dielectric cap on the exposed surfaces of each of the source/drain contacts and depositing another layer of ILD over the semiconductor structure. The method includes patterning and etching holes for each of the gate contacts and for each gate jumper where the holes for the gate jumper extend over two or more adjacent gates and the dielectric cap on the source/drain contact residing between the adjacent gates. The gate contact metal is deposited along with an optional liner. The surface of the semiconductor structure is planarized to remove excess gate metal from the top surface of the ILD to form the gate contacts and the gate jumper. Using conventional back end of the line (BEOL) semiconductor processes, another layer of ILD is deposited over the gate contacts, gate jumper, and the original ILD to form vias connecting the next level metal in the semiconductor structure. As previously discussed above, while the method of forming the gate jumper is illustrated for a nanosheet transistor, embodiments of the present invention include forming gate jumpers in other types of logic devices and forming the gate jumper disclosed herein in memory devices, where the gate jumper is over the dielectric cap on a top portion of the source/drain residing between the adjacent gates connected by the gate jumper.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration purposes only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layers at the interface of the two elements.

In the interest of not obscuring the presentation of embodiments of the present invention, in the following detailed description, some processing steps or operations that are known in the art may have been combined for presentation and illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so many of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. For the purposed of the present invention, the terms "nanosheet stack" and "nanosheet stack" are interchangeable. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described. It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes as used herein include but are not limited to ionized plasma vapor deposition (iPVD), plasma vapor deposition (PVD), electroplating atomic layer deposition (ALD), plasma-enhanced chemical vapor deposition (PECVD), CVD, gas cluster ion beam (GCIB) deposition, ionized plasma vapor deposition (iPVD), PVD, or electroplating.

Selectively etching as used herein includes but is not limited to patterning using one of lithography, photolithography, an extreme ultraviolet (EUV) lithography process, or any other known semiconductor patterning process followed by one or more the etching processes. Some examples of etching processes include but are not limited to the following processes, such as a dry etching process using a reactive ion etch (RIE) or ion beam etch (IBE), a wet chemical etch process, or a combination of these etching processes. A dry etch may be performed using a plasma. Ion milling, sputter etching, or reactive ion etching (ME) bombards the wafer with energetic ions of noble gases that approach the wafer approximately from one direction, and therefore, these processes are an isotropic or directional etching processes.

Reference is now made to the figures. The figures provide a schematic cross-sectional illustration of semiconductor devices at intermediate stages of fabrication, according to one or more embodiments of the invention. The figures provide schematic representations of the devices of the invention and are not to be considered accurate or limiting with regards to device element scale.

FIG. 1A depicts cross-sectional view 100A of the semiconductor structure across gates 7 after depositing ILD 8 on a portion of a nanosheet transistor, in accordance with an embodiment of the present invention. As depicted, FIG. 1A includes substrate 2, an optional bottom dielectric isolation (BDI) 3, Source/drain (S/D) epitaxy 4, semiconductor channel layers 5, inner spacers 6, gates 7, gate spacers 9, and interlayer dielectric (ILD) 8. The semiconductor structure depicted in cross-section 100A can be formed with conventional front-end of the line (FEOL) processes and after a middle of the line (MOL) interlayer dielectric material deposition of ILD 8.

The semiconductor structure of cross-section 100A is depicted as a portion of a nanosheet transistor (e.g., without contacts) however, in other embodiments, the semiconductor structure of cross-section 100A is a portion of a memory device (e.g., a magnetoresistive random-access memory (MRAM) device, a phase-change memory (PCM) device, a dynamic RAM (DRAM), etc.). In some embodiments, the semiconductor structure of cross-section 100A is a portion of another logic device (e.g., a planar field-effect transistor (FET), a finFET, etc.).

Figure 7:
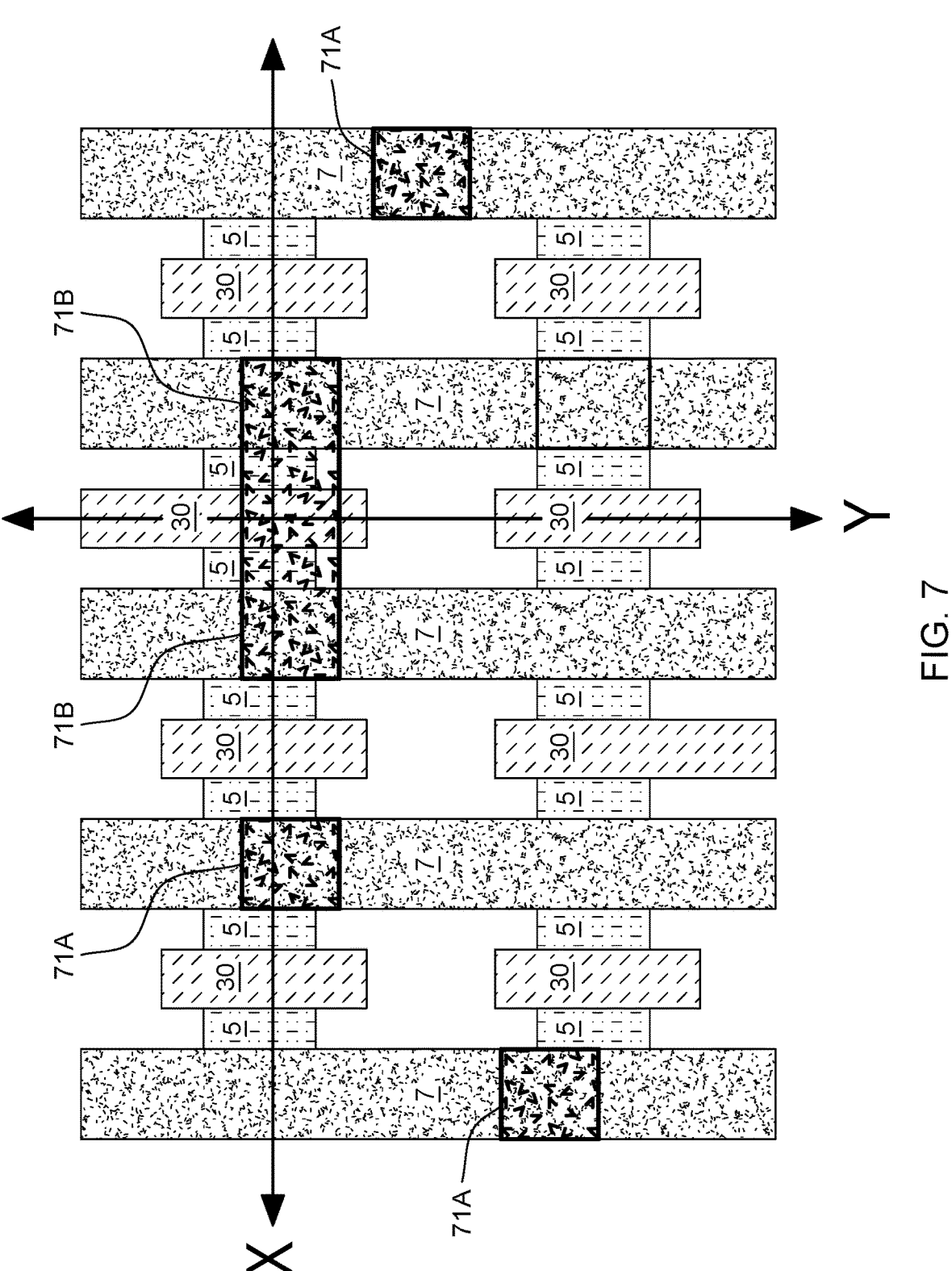
FIG. 7 is an isometric top view of the semiconductor structure through the ILD of the nanosheet transistor, in accordance with an embodiment of the present invention.

Cross-sectional views 100A, 200A, 300A, 400A, 500A, 600A, and 800A of the semiconductor structures are across or perpendicular to the length of gates 7. The location of the cross-sectional views perpendicular to gates 7 is depicted as X-X in FIG. 7. Cross-sectional views 100A, 200A, 300A, 400A, 500A, 600A, 800A, and 900A as depicted in FIG. 7 run through and along a fin in the X-X direction depicted in FIG. 7. The portion of a nanosheet transistor depicted in FIG. 1A (e.g., substrate 2, BDI 3, S/D epitaxy 4, semiconductor channel layers 5, inner spacers 6, gate spacers 9, ILD 8, and gates 7) can be formed with conventional nanosheet transistor fabrication processes as known to one skilled in the art.

In various embodiments, substrate 2 is a semiconductor wafer or a portion of a semiconductor wafer. In some embodiments, substrate 2 is a portion of a semiconductor-on-insulator (SOI) substrate. For example, after removing a wafer or a semiconductor layer (e.g., by back side wafer grind), the SOI may be composed of substrate 2 and BDI 3 where BDI 3 is a buried oxide or BOX). In various embodiments, substrate 2 is a silicon substrate. In other embodiments, substrate 2 is another type of semiconductor substrate (e.g., Ge, GaAs, etc.). Substrate 2 may be doped, undoped, or contain doped or undoped regions or may be a layered semiconductor substrate. In some embodiments, substrate 2 is a silicon substrate with BDI 3 that can be composed of any material used as an etch stop (e.g., silicon germanium, etc.).

In various embodiments, BDI 3 is bottom dielectric isolation. For example, BDI 3 is composed of a low-k material such as SiO, SiOC, SiOCN, SiBCN, or another suitable dielectric material used in a bottom dielectric isolation layer. In an embodiment, BDI 3 is a layer of a buried oxide (BOX) in a silicon on insulator (SOI) wafer. BDI 3 is an optional element in FIG. 1A and may not present in other examples of the present invention.

The portion of the nanosheet transistor depicted in FIG. 1A includes semiconductor channel layers 5 which can be the layers of a semiconductor material such as but not limited to silicon. For example, semiconductor channel layers 5 can be composed of any semiconductor material used for a portion of a semiconductor device channel in a nanosheet transistor and may be doped or undoped. As depicted in FIG. 1A, portions of semiconductor channel layers 5 may be surrounded by gates 7 (e.g., to create channels in semiconductor channel layers 5 between the portions of gates 7 in a gate-all-around field-effect transistor formed with the nanosheet transistor). Similarly, gates 7 can each be a gate structure formed using known gate materials and processes as known to one skilled in the art. For example, gates 7 can be a high k metal gate structure that can include a layer of a gate dielectric material (not depicted) such as a high k gate dielectric (e.g., hafnium oxide, or another high k metal oxide), one or more work function metals (not depicted) such as but not limited to, titanium nitride, titanium carbide, and a gate metal such as W. Gates 7 are not limited to these materials and gate elements. As depicted in FIG. 1A, gate spacers 9 surround a top portion of gates 7 may be composed of any known spacer dielectric material.

The portion of the nanosheet transistor depicted in FIG. 1A also includes inner spacers 6 that can be composed of a spacer material, such as SiN, SiBCN, SiOCN, SiOC, or other suitable spacer material. In various embodiments, S/D epitaxy 4 can be epitaxially grown on BDI 3 above substrate 2, where S/D epitaxy 4 can be composed of any known S/D material.

ILD 8 deposited by known or middle of the line (MOL) or back end of the line (BEOL) dielectric material deposition processes on the top surfaces of gates 7, gate spacers 9, and S/D epitaxy 4 can be composed of any dielectric material such as $SiO_2$, another oxide material, or a nitride material used for interlayer dielectrics in nanosheet transistors or other semiconductor devices. A chemical-mechanical polish (CMP) planarizes the semiconductor structure.

Figure 1B:
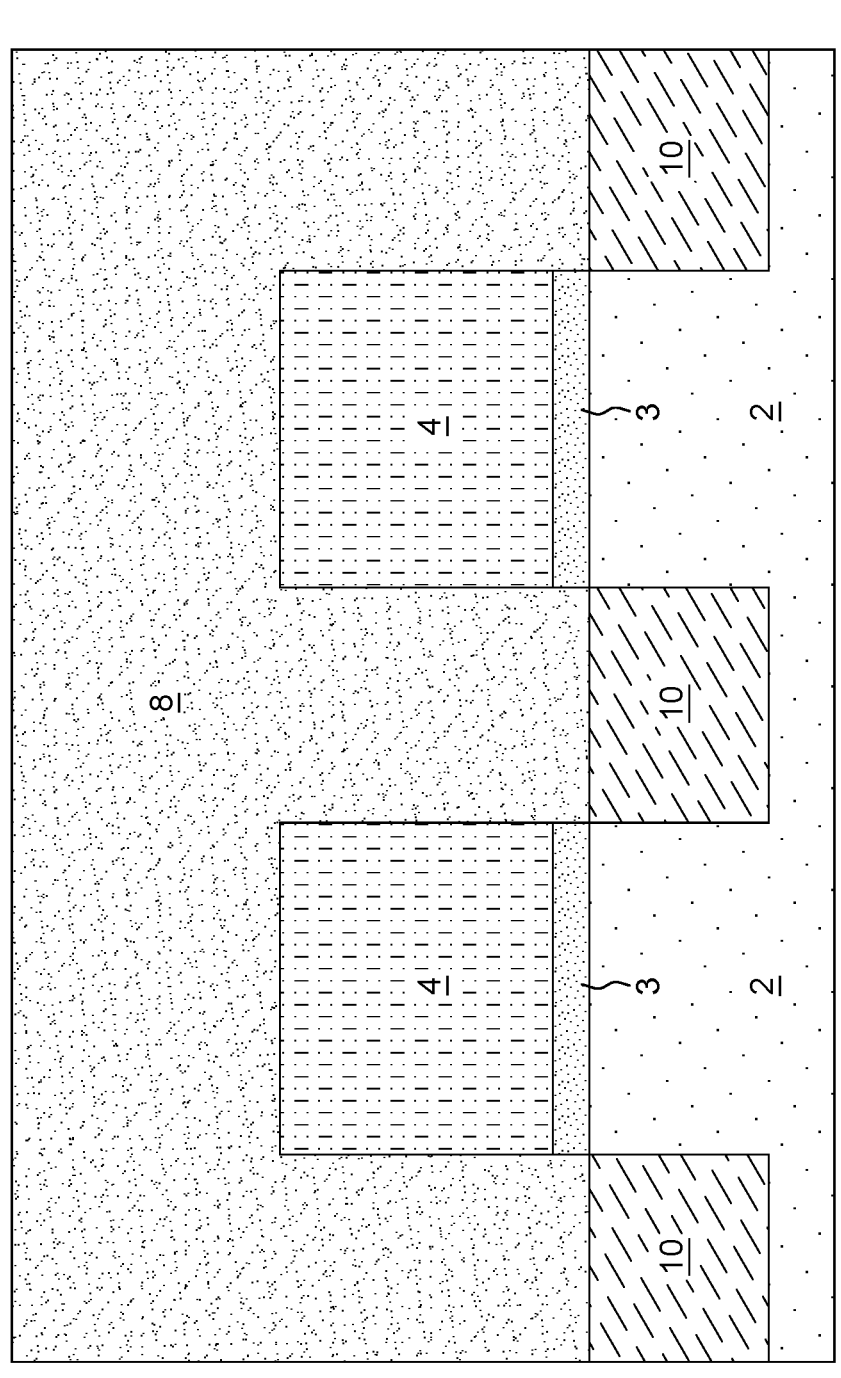
FIG. 1B depicts a cross-sectional view of the semiconductor structure of a portion of the nanosheet transistor that is parallel to the gates of the nanosheet transistor in the source-drain contact region, in accordance with an embodiment of the present invention.

FIG. 1B depicts cross-sectional view 100B of the semiconductor structure of a portion of the nanosheet transistor that is parallel to gates 7 of the nanosheet transistor, in accordance with an embodiment of the present invention. As depicted, FIG. 1B includes substrate 2, shallow trench isolation (STI) 10, BDI 3, S/D epitaxy 4, and ILD 8. The cross-section views 100B, 200B, 300B, 400B, 500B, 600B, and 800B of the semiconductor structures are parallel to the length of gates 7 in the source-drain contact region between two of gates 7. The location of the cross-sectional views parallel and between two of gates 7 is depicted as Y-Y in FIG. 7. As depicted in FIG. 1B, each of STI 10 resides in substrate 2 adjacent to and between each transistor device below BDI 3. Each S/D epitaxy 4 resides on one of BDI 3 adjacent to STI 10. ILD 8 can be deposited on STI 10 and S/D epitaxy 4 and planarized using the processes discussed above with reference to FIG. 1A to form the semiconductor structure depicted in FIG. 1B.

Figure 2A:
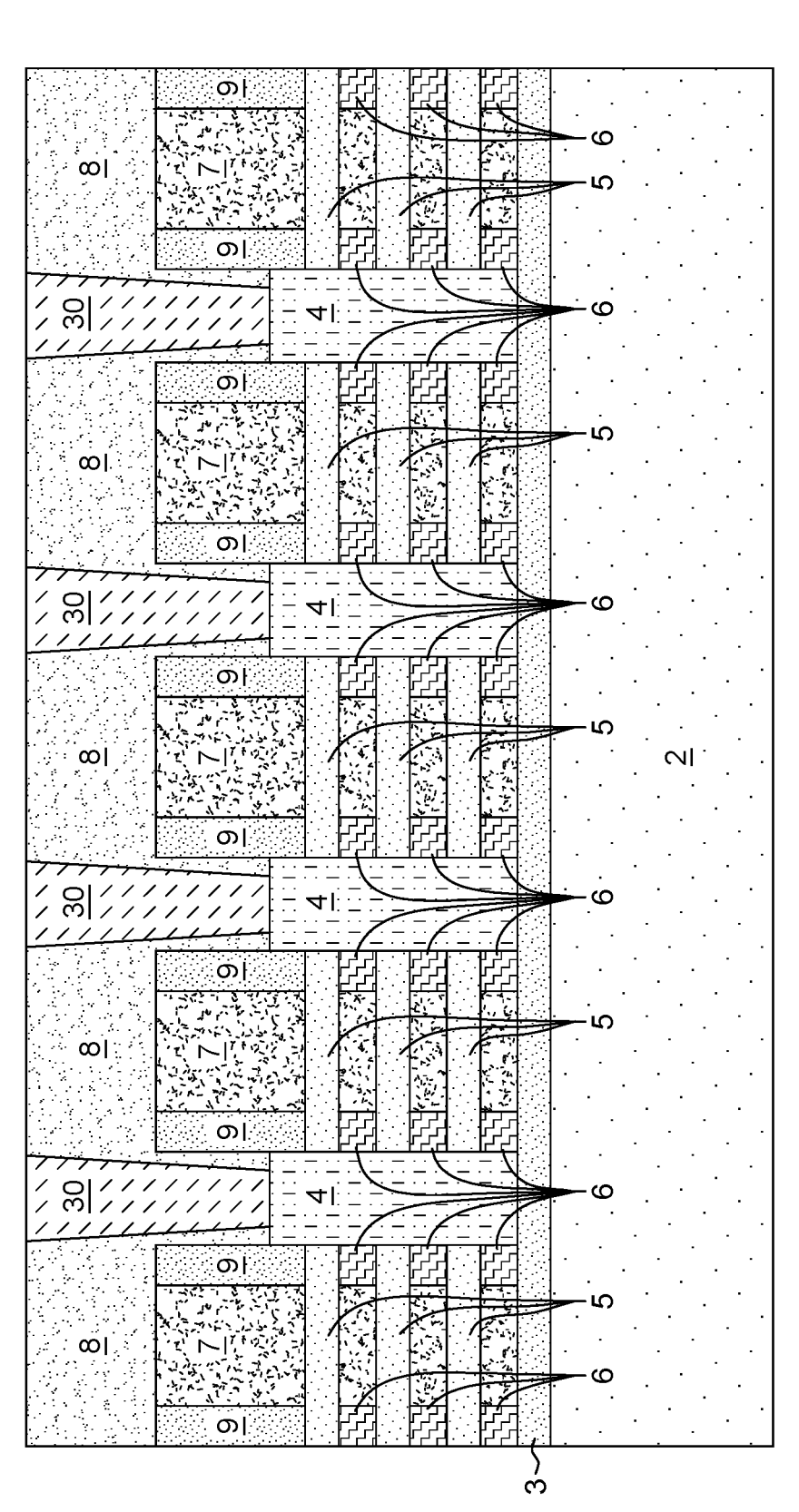
FIG. 2A depicts a cross-sectional view of the semiconductor structure across the gates of the nanosheet transistor after forming source/drain contacts, in accordance with an embodiment of the present invention.

FIG. 2A depicts cross-sectional view 200A of the semiconductor structure after forming S/D contacts 30, in accordance with an embodiment of the present invention. As depicted, FIG. 2A includes the elements of FIG. 1A with S/D contacts 30 added. Using known patterning and contact metal deposition processes followed by a CMP, multiple S/D contacts 30 are formed where each of S/D contacts 30 is formed over and above each of S/D epitaxy 4. S/D contacts 30 may be composed of any known conductive contact material such as but not limited to tungsten, cobalt, ruthenium, etc. As depicted, S/D contacts 30 are above and connect to S/D epitaxy 4.

Figure 2B:
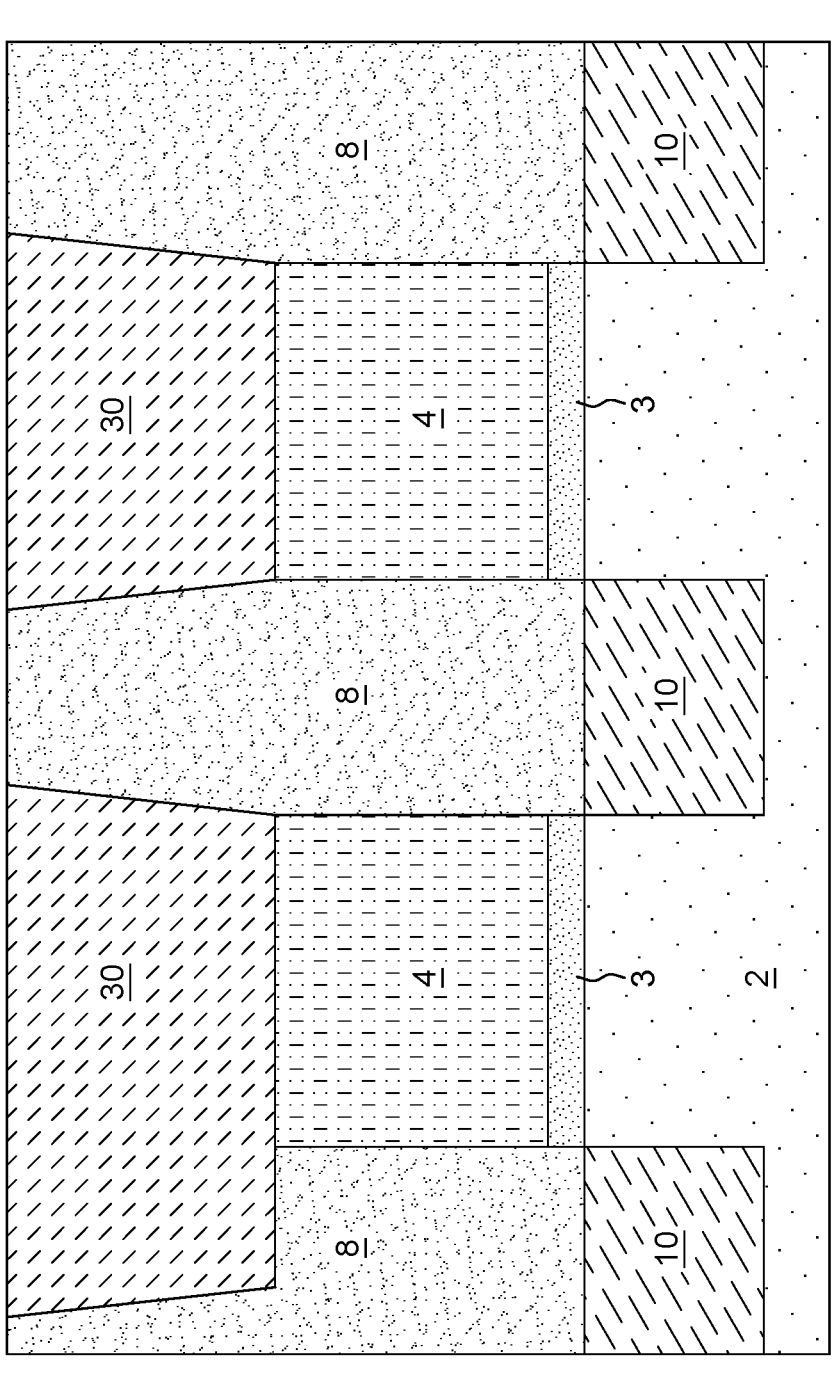
FIG. 2B depicts a cross-sectional view of the semiconductor structure that is parallel to the gates of the nanosheet transistor in the source-drain contact region after forming the source/drain (S/D) contacts, in accordance with an embodiment of the present invention.

FIG. 2B depicts cross-sectional view 200B of the semiconductor structure after forming S/D contacts 30, in accordance with an embodiment of the present invention. As depicted, FIG. 2B includes the elements of FIG. 1A with the addition of S/D contacts 30. In cross-sectional view 200B, two S/D contacts 30 above two S/D epitaxy 4 are depicted where the leftmost of S/D contacts 30 is longer and extends beyond the outer edge of the leftmost S/D epitaxy 4 and over a portion of ILD 8.

Figure 3A:
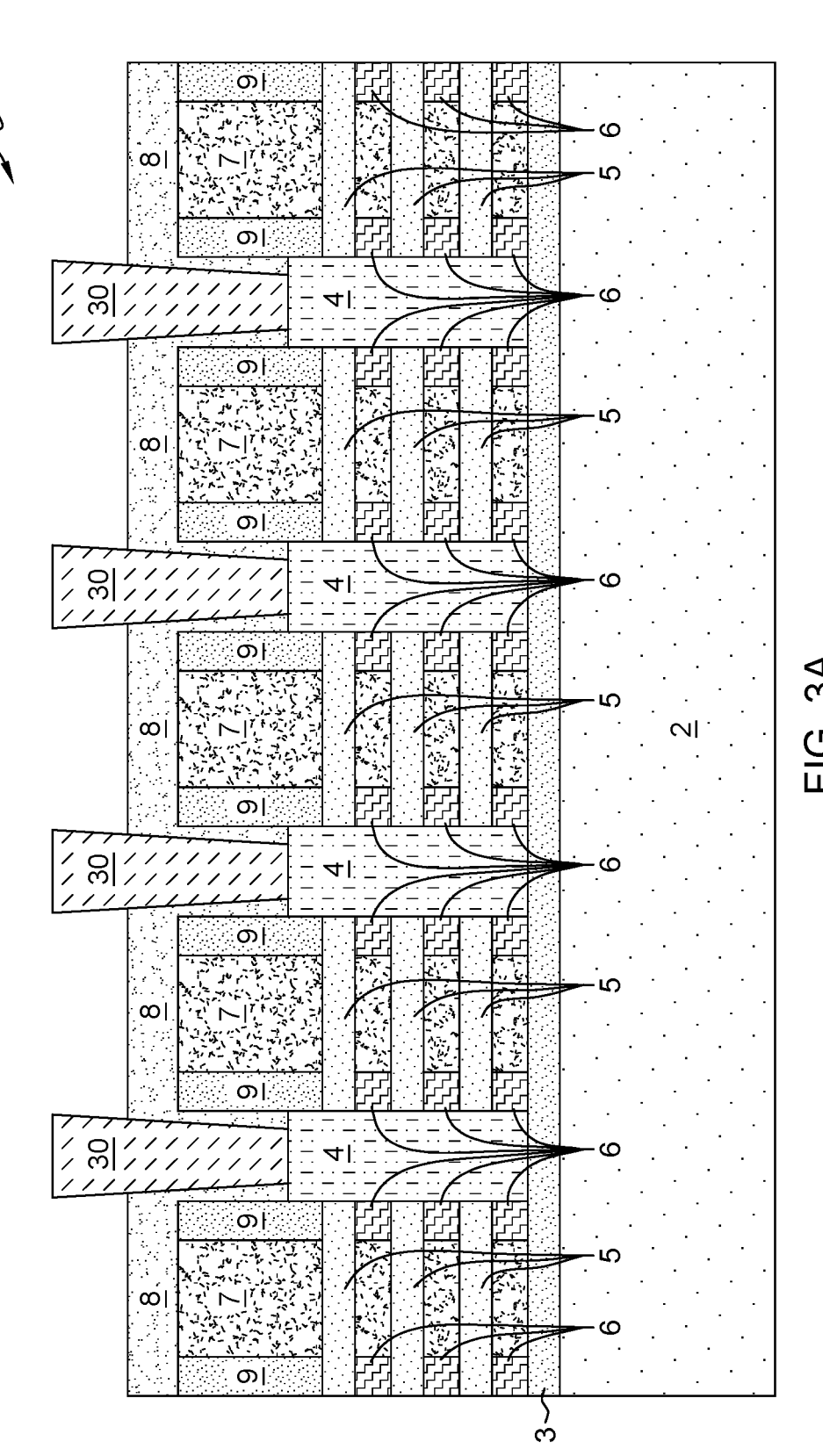
FIG. 3A depicts a cross-sectional view of the semiconductor structure across the gates of the nanosheet transistor after selectively recessing an interlayer dielectric (ILD), in accordance with an embodiment of the present invention.

FIG. 3A depicts cross-sectional view 300A of the semiconductor structure after selectively removing a top portion of ILD 8, in accordance with an embodiment of the present invention. As depicted, FIG. 3A includes the elements of FIG. 2A after recessing portions of ILD 8 between S/D contacts 30. A top portion of ILD 8 is removed to expose the top portion of S/D contacts 30.

Using a selective dielectric etching process, such as but not limited to a wet or dry etch process that is selective to the S/D contact metal and dependent on the ILD material, the top portion of ILD 8 is removed. The etching process recesses the exposed portions of ILD 8 adjacent to S/D contacts 30. After recessing ILD 8, approximately ten to twenty nanometers (nm) of ILD 8 remains above gate spacers 9 and gates 7 adjacent to S/D contacts 30 but the amount of ILD 8 remaining above gate spacers 9 and gates 7 is not limited to these amounts. In other examples, more or less of ILD 8 may remain after the etching process to recess ILD 8.

Figure 3B:
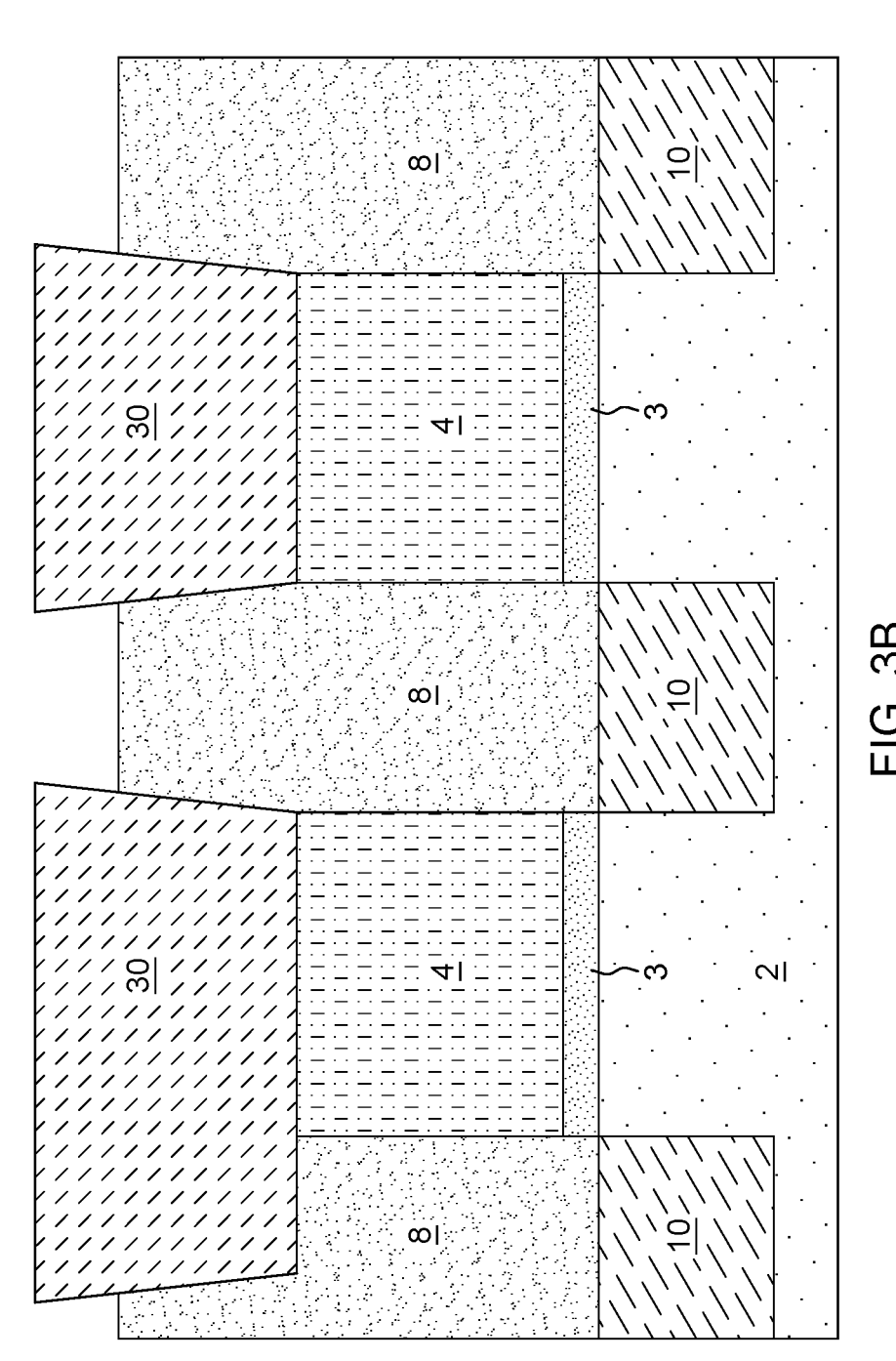
FIG. 3B depicts a cross-sectional view of the semiconductor structure that is parallel to the gates of the nanosheet transistor in the source-drain contact region after selectively recessing the ILD, in accordance with an embodiment of the present invention.

FIG. 3B depicts cross-sectional view 300B of the semiconductor structure after removing the top portion of ILD 8, in accordance with an embodiment of the present invention. As depicted, FIG. 3B includes the elements of FIG. 2B minus the top portion of ILD 8. Using the selective dielectric etching process discussed above, the top portion of ILD 8 can be removed above STI 10 or above a significant portion of STI exposing the top portion of S/D contacts 30.

Figure 4A:
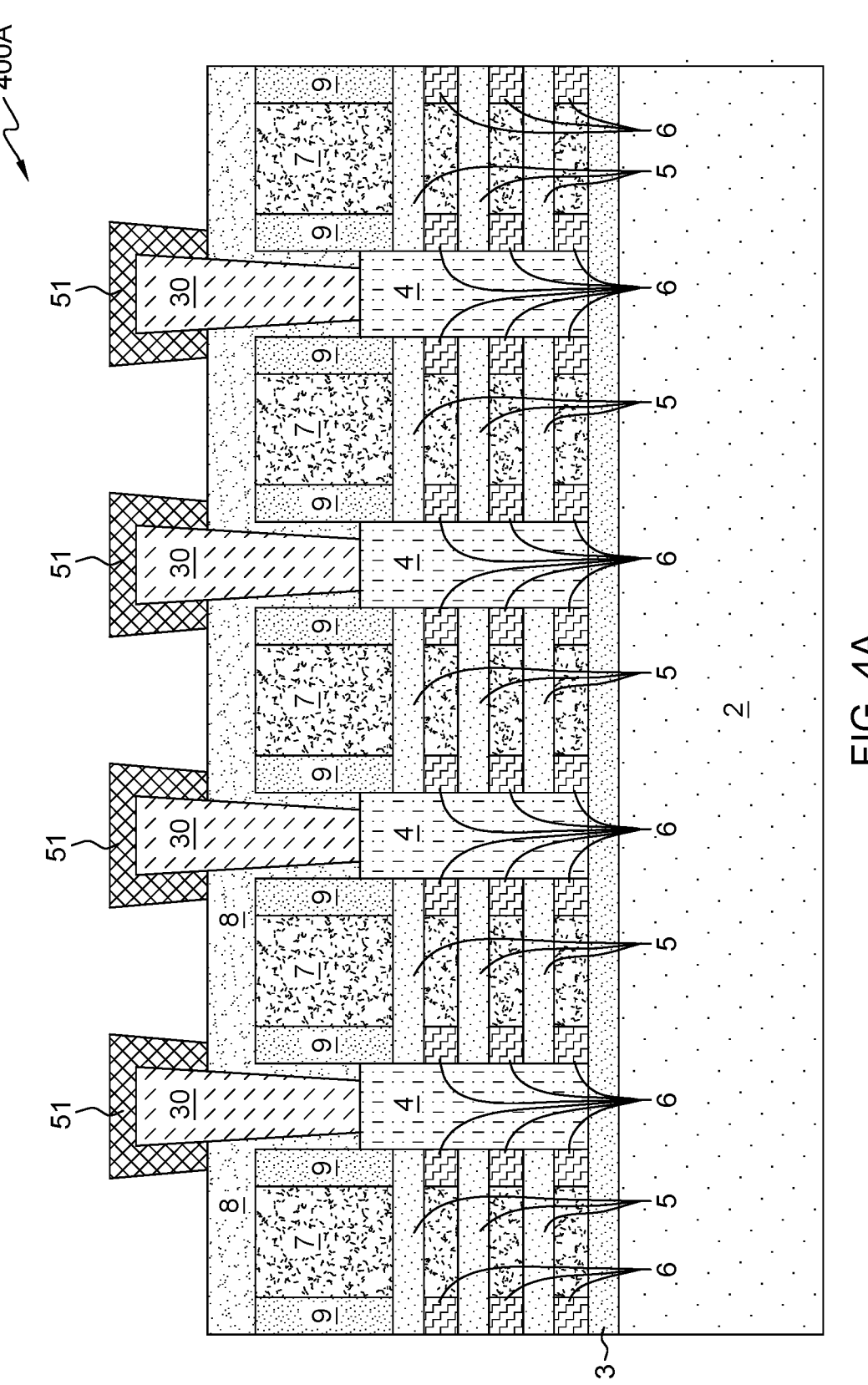
FIG. 4A depicts a cross-sectional view of the semiconductor structure across the gates of the nanosheet transistor after selectively forming a dielectric material on the exposed surfaces of the S/D contacts, in accordance with an embodiment of the present invention.

FIG. 4A depicts cross-sectional view 400A of the semiconductor structure after a selective deposition of dielectric cap 51 on the exposed top portion of S/D contacts 30, in accordance with an embodiment of the present invention. As depicted, FIG. 4A includes the elements of FIG. 3A and dielectric cap 51. While FIG. 4A depicts dielectric cap 51 over the exposed portions of S/D contacts 30 above ILD 8 after recessing ILD 8 as previously discussed.

In various embodiments, a layer of dielectric cap 51 is formed on exposed portions of S/D contacts 30. For example, using known wet or dry oxidation and nitridation processes, a thin layer of oxide or nitride with a thickness ranging from three to ten nanometers is formed on the exposed surfaces of S/D contacts 30. In other examples, the oxide may be formed on only the top surfaces of S/D contacts 30 using a spinning dielectric deposition process or an anisotropic dielectric deposition favoring horizontal surfaces combined with an etch back process. In yet other examples, dielectric cap 51 may be selectively deposited by selective atomic layer deposition (ALD) including but not limited to TiO, AlO, SiO, SiN, SiC, SOC, SiON, SiOCN, SiBCN on S/D contacts 30. The selective deposition processes or selective oxidation processes and materials are not limited the processes and materials in these examples. The thickness of dielectric cap 51 on a portion of each of S/D contacts 30 can range from five to fifteen nanometers but is not limited to these thicknesses.

In one example, dielectric cap 51 may be deposited by conventional dielectric deposition processes, such as ALD, PVD, etc., patterned using lithography, and etched to remove dielectric cap 51 on ILD 8 between each of S/D epitaxy 4. The deposition or formation of dielectric cap 51 is not limited to these examples but may occur by any developed or developing method of dielectric deposition or oxide formation for covering or selectively covering the exposed portions of S/D contacts 30.

Figure 4B:
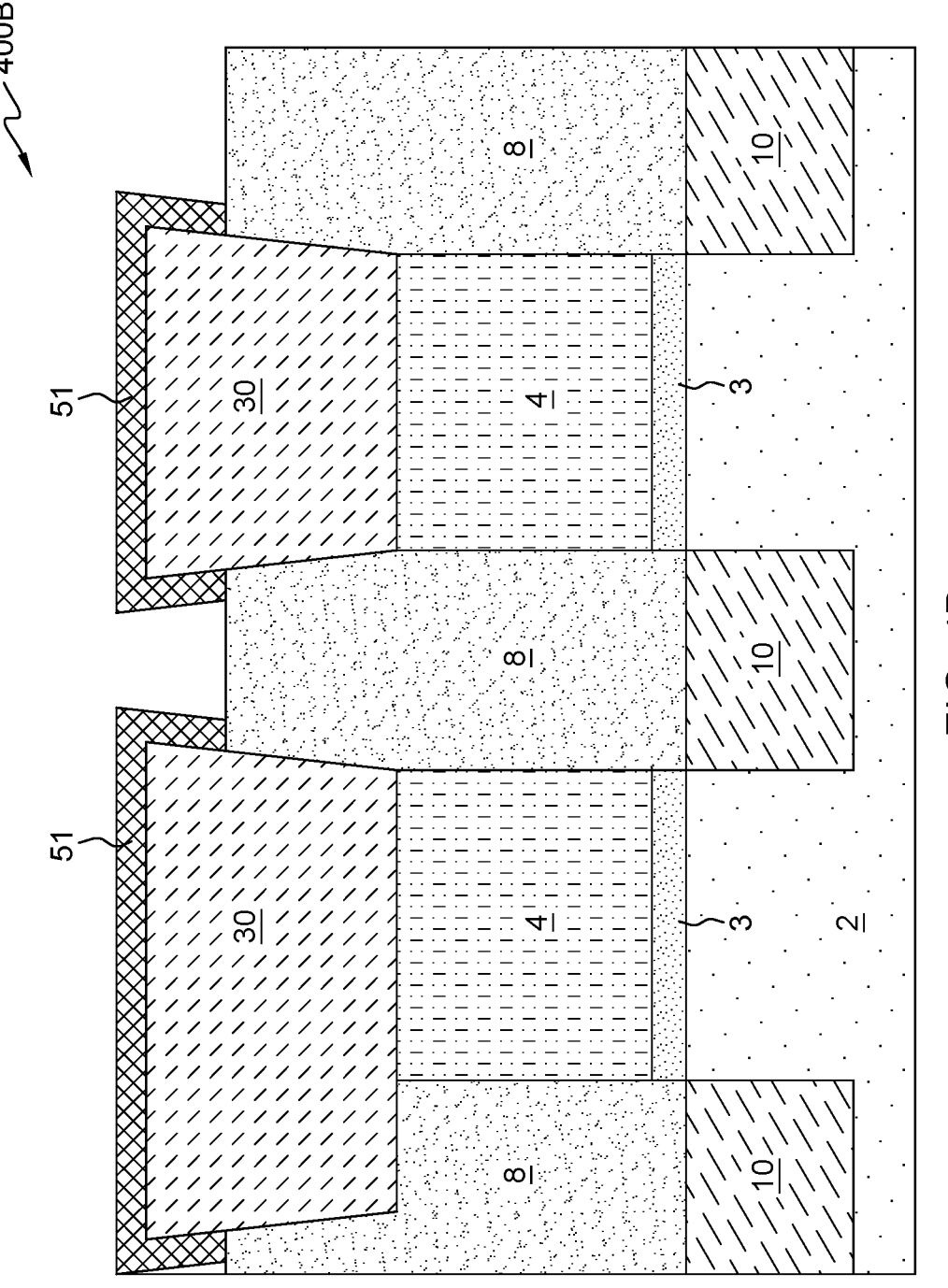
FIG. 4B depicts a cross-sectional view of the semiconductor structure that is parallel to the gates of the nanosheet transistor in the source-drain contact region after the selective deposition of the dielectric material on the exposed S/D contact surfaces, in accordance with an embodiment of the present invention.

FIG. 4B depicts a cross-sectional view 400B of the semiconductor structure after selectively depositing or forming dielectric cap 51 on S/D contacts 30, in accordance with an embodiment of the present invention. As depicted, FIG. 4B includes the elements of FIG. 3B and dielectric cap 51. As depicted in FIG. 4B, dielectric cap 51 covers the exposed surfaces of S/D contacts 30.

Using one or more of the processes discussed above with reference to FIG. 4A, dielectric cap 51 is deposited or formed on S/D contacts 30. As depicted, dielectric cap 51 does not cover ILD 8.

Figure 5A:
FIG. 5A depicts a cross-sectional view of the semiconductor structure across the gates of the nanosheet transistor after depositing an ILD and etching holes for the gate contacts and gate jumpers, in accordance with an embodiment of the present invention.

FIG. 5A depicts cross-sectional view 500A across gates 7 of the semiconductor structure after depositing another layer of ILD 81 and etching holes for the gate contacts and the gate jumper, in accordance with an embodiment of the present invention. As depicted, FIG. 5A includes the elements of FIG. 4A and ILD 81.

The second deposited layer of an ILD material labeled as ILD 81 can be composed of the same dielectric material as ILD 81 deposited in FIG. 1A or composed of a different dielectric material. ILD 81 can be any dielectric material used as an interlayer dielectric in semiconductor devices and may be deposited by a conventional BEOL or MOL deposition process (e.g., PVD, CVD, etc.). ILD 81 can be deposited over exposed surfaces gates 7, ILD 8, gate spacers 9, dielectric cap 51, and exposed surfaces of S/D contacts 30. In some cases, a CMP planarizes the top surface of ILD 81.

Before patterning and etching ILD 81 to recess ILD 81 between S/D contacts 30, the top surface of ILD 81 may be 10 to 30 nm above the top surface of dielectric cap 51 but is not limited to this range of height above dielectric cap 51. The top surface of ILD 81 can be patterned, for example, by lithography, and etched using one or more known dielectric etching processes.

In various embodiments, a self-aligning, isotropic etching process (e.g., ME) removes portions ILD 81. The etching process does not etch dielectric cap 51 and stops at the top surface of gates 7. The ME self-aligns on dielectric cap 51 when etching the holes or trenches for the gate jumper. As depicted in FIG. 5A, the patterning, and etching of ILD 81 results in two holes where the leftmost hole or gate contact hole is centered over one of gates 7 and the rightmost opening or hole is larger and is formed over two or more of gates 7 and extending over one of dielectric cap 51 residing between the two exposed gates 7. While FIG. 5A depicts only two recesses or holes formed during the etching of ILD 81, as known to one skilled in the art, any number holes or recesses for contact vias or any number of a larger holes or recesses between two or more of gates 7 may be formed.

The spacing between the leftmost hole (e.g., for a gate contact) and the leftmost edge of the rightmost hole (e.g., for the gate jumper formed later) is approximately or slightly less than the contact gate pitch (CGP). The length of the rightmost hole for the gate jumper is approximately the same as or slightly larger than the CGP of the semiconductor device. In some cases, when the gate jumper connects more than two of gates 7, the length of the hole can be two or more CGP.

Figure 5B:
FIG. 5B depicts a cross-sectional view of the semiconductor structure that is parallel to the gates of the nanosheet transistor in the source-drain contact region after depositing an ILD and etching holes for the gate contacts and gate jumpers, in accordance with an embodiment of the present invention.

FIG. 5B depicts a cross-sectional view 500B of the semiconductor structure that is parallel to and between gates 7 of the nanosheet transistor after depositing ILD 81 and etching holes for the gate contacts and the gate jumper, in accordance with an embodiment of the present invention. As depicted, FIG. 5B includes substrate 2, BDI 3, S/D epitaxy 4, S/D contacts 30, ILD 8, STI 10, dielectric cap 51, and ILD 81 where ILD 8 and ILD 81 may be composed of the same or different dielectric materials.

Using known dielectric deposition processes such as PVD, CVD, or ALD, a layer of ILD 81 is deposited. After ILD 81 deposition, the top surface of ILD 81 is patterned, for example, using a gate contact mask that includes patterning for the gate jumper. A self-aligning etching process, such as ME, removes exposed portions of ILD 81 but does not remove dielectric cap 51 or the materials under dielectric cap 51. The etching process stops on dielectric cap 51. As depicted in FIG. 5B, a hole or trench is formed above dielectric cap 51 for a gate jumper formed in later process steps.

Because dielectric cap 51 covers each of S/D contacts 30 and dielectric cap 51 is not removed by the RIE, if the gate mask for patterning the gate contacts and the gate jumpers is misaligned, shorting of the gate contact or the gate jumper formed in later process steps to S/D contacts 30 will not occur due to the presence of dielectric cap 51 over S/D contacts 30. Dielectric cap 51 electrically isolates S/D contacts 30 from the gate contact and gate jumper formed in the completed semiconductor device.

Figure 6A:
FIG. 6A depicts a cross-sectional view across the gates of the nanosheet transistor after depositing and polishing a contact material, in accordance with an embodiment of the present invention.

FIG. 6A depicts a cross-sectional view 600A of the semiconductor structure across gates 7 of the nanosheet transistor after forming gate contact 71A and gate jumper 71B, in accordance with an embodiment of the present invention. As depicted, FIG. 6A includes the elements of FIG. 5A and gate contact 71A and gate jumper 71B. Gate jumper 71B in FIG. 6A connects two adjacent gates 7 when the gate contact material is deposited over the two gates 7 and dielectric cap 51 resides between the two connected gates 7.

Using conventional MOL processes, a liner material (not depicted in FIG. 6A) may be deposited over the semiconductor structure. For example, using one or more known deposition processes such as PVD, ALD, or CVD, one or more layers of conventional liner materials such as Ti, TiN, TaN, or other typical liner materials are deposited over the semiconductor structure and in the holes or trenches for forming the gate contact and the gate jumper. After the optional liner material deposition, a layer of gate contact material such as but not limited to tungsten, cobalt, molybdenum, copper, ruthenium, or a metal compound such as tungsten carbide is deposited over the semiconductor structure filling the holes or trenches that can include a liner (not depicted in FIG. 6A).

A CMP removes excess liner material and gate contact material above ILD 8. After CMP, gate contact 71A and gate jumper 71B are formed in the remaining ILD 8. As depicted in FIG. 6A, gate contact 71A is formed to the left of gate jumper 71B. As known to one skilled in the art, any number gate contacts 71A and gate jumpers 71B may be formed above or connecting any of gates 7 in a semiconductor device or chip.

In FIG. 6A, gate contact 71A connects to a single gate of gates 7. Gate jumper 71B connects to two adjacent gates of gates 7 by extending with a bridge of gate contact material over one of dielectric cap 51 residing between the two adjacent and connected gates 7. For example, after the CMP, the thickness of the bridge of the gate material over dielectric cap 51 in gate jumper 71B connecting the two adjacent gates 7 can range from ten to thirty nanometers but is not limited to these thicknesses. In some embodiments, gate jumper 71B connects four of gates 7 by extending over three of dielectric caps 51.

As depicted in FIG. 6A and as previously discussed, dielectric cap 51 prevents shorting of gate contact 71A and gate jumper 71B to adjacent S/D contacts 30 even when the gate etch mask for forming holes and trenches for gate contact 71A and gate jumper 71B is misaligned. When misalignment of the gate contact etch mask occurs (not depicted in either FIG. 5A or FIG. 6A), the holes or trenches for gate contact 71A and gate jumper 71B extend over dielectric cap 51 and at least one of gates 7 rather than forming over gates 7 as depicted in FIG. 5A. By providing the semiconductor structure depicted in FIG. 6A, S/D contacts 30 covered by dielectric cap 51 avoid shorting to gate contact 71A or gate jumper 71B when gate contact masks for patterning gate holes and gate jumper holes are misaligned.

Figure 6B:
FIG. 6B depicts a cross-sectional view of the semiconductor structure that is parallel to the gates of the nanosheet transistor in the source-drain contact region after depositing and polishing a contact material, in accordance with an embodiment of the present invention.

FIG. 6B depicts a cross-sectional view 600B of the semiconductor structure that is parallel to gates 7 and between gates 7 of the nanosheet transistor after depositing and polishing a conductive contact material to form gate jumper 71B and gate contact 71A (not depicted in FIG. 6B), in accordance with an embodiment of the present invention. As depicted, FIG. 6B includes the elements of FIG. 5B and gate jumper 71B. In FIG. 6B, gate jumper 71B resides on the larger or longer of the two S/D contacts 30.

Gate jumper 71B can be formed with the processes and materials described above (e.g., optional liner deposition, gate contact material deposition, and CMP). Cross-sectional view 600B depicted a portion of gate jumper 71B that resides on dielectric cap 51. The thickness of gate jumper 71B over dielectric cap 51 may typically range between ten and thirty nanometers but is not limited to these thicknesses.

FIG. 7 is one example of an isometric top view of the nanosheet transistor through the dielectric material, in accordance with an embodiment of the present invention. As depicted, FIG. 7 is one example of an illustration of a top view of the nanosheet transistor looking through ILD 81, ILD 8, gate spacers 9, and dielectric cap 51. FIG. 7 includes gate jumper 71B, three of gate contact 71A, gates 7, semiconductor channel layers 5, and S/D contacts 30 where semiconductor channel layers 5 in FIG. 7 may also be known as the active device region FIG. 7 also depicts a location of X-X cross-sections across gates 7 and a location of Y-Y cross-sections that are parallel to gates 7 and between two of gates 7. For example, cross-sectional view 600A would be through X-X depicted in FIG. 7 and cross-sectional view 600B could be through Y-Y depicted in FIG. 7. The cross-section through X-X depicts gate contact 71A over one of gates 7 and gate jumper 71B. Gate jumper 71B is depicted over one of S/D contacts 30 where dielectric cap 51 on S/D contact 30 is not depicted in FIG. 7 and gate jumper 71B connects two adjacent gates 7. The two adjacent gates 7 surround the left and right sides of one of S/D contacts 30 residing between the two adjacent gates 7 connected by gate jumper 71B.

Figure 8A:
FIG. 8A depicts a cross-sectional view of the semiconductor structure across the gates of the nanosheet transistor after depositing another layer of ILD material and etching via holes in the ILD material, in accordance with an embodiment of the present invention.

FIG. 8A depicts a cross-sectional view 800A of the semiconductor structure across the gates a nanosheet transistor after depositing another layer of ILD 81 and etching via holes in ILD 81, in accordance with an embodiment of the present invention. As depicted, FIG. 8A includes the elements of FIG. 6A with another layer of ILD 81 deposited over gate contact 71A, gate jumper 71B, and ILD 81. ILD 81 can be the same dielectric material as the initially deposited layer of ILD 81 in FIG. 6A. In one embodiment, the ILD material deposited in FIG. 8A (labeled as ILD 81) is an ILD material with a different composition than the originally deposited interlayer dielectric material for ILD 81 (e.g., ILD 81 deposited in cross-sectional view 600A of FIG. 6A). Vias holes exposing a portion of the top surface of contacting S/D contacts and via holes exposing a portion of the top surface of gate contacts 71A and gate jumper 71B are sequentially formed.

Using known MOL processes for interconnect wiring formation including interlayer dielectric material deposition, more ILD 81 is deposited over the semiconductor structure. The vias holes for the vias contacting S/D contacts 30 are formed, for example, using a coating of an organic planarization layer (OPL), patterning (e.g., lithography), via hole etching process (e.g., RIE), and OPL ash. The vias holes for the vias contacting a portion of the top surface of one or more of gate contacts 71A and gate jumper 71B may be formed in ILD 81 with the same or similar MOL processes (e.g., OPL coating, OPL patterning, via hole etch, and OPL ash) before or after the via holes contacting at least one of S/D contacts 30.

Figure 8B:
FIG. 8B depicts a cross-sectional view of the semiconductor structure that is parallel to the gates of the nanosheet transistor in the source-drain contact region after depositing another layer of ILD material and etching via holes in the ILD, in accordance with an embodiment of the present invention.

FIG. 8B depicts a cross-sectional view 800B of the semiconductor structure that is parallel to the gates of the nanosheet transistor after depositing another layer of ILD 81 and forming via holes, in accordance with an embodiment of the present invention. As depicted, FIG. 8B includes the elements of FIG. 6B with an additional layer of ILD 81 deposited and via holes formed in ILD 81. FIG. 8B illustrates three via holes formed in ILD 81.

Using MOL processes discussed above for via hole formation (e.g., ILD deposition, OPL deposition, OPL patterning, and via hole etching), three via holes are illustrated in FIG. 8B. The leftmost via hole is etched down through ILD 81 and dielectric cap 51 to expose the top surface of one of S/D contacts 30. The middle via hole is etched down through a portion of ILD 81 to expose the top surface of gate contact 71A. The rightmost via hole is etched down through ILD 81 and dielectric cap 51 to expose the top surface of another of S/D contacts 30. In other examples, more or less via holes may be etched to contact gate contact 71A or S/D contacts 30 or in other cases (not depicted in FIG. 8B), via holes may expose a top surface of gate jumper 71B.

Figure 9A:
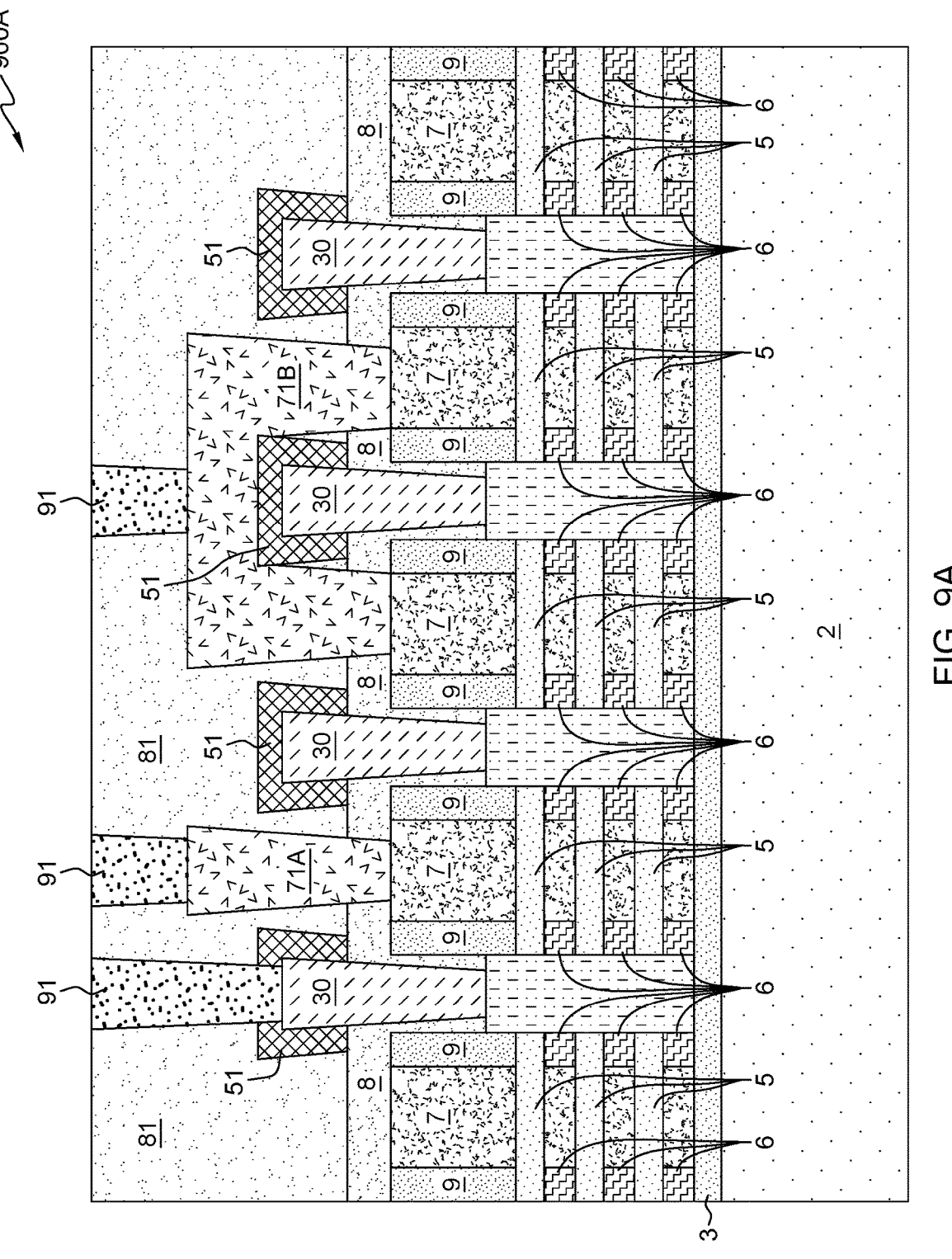
FIG. 9A depicts a cross-sectional view of the semiconductor structure across the gates of the nanosheet transistor after forming vias to the next metal layer in the nanosheet transistor, in accordance with an embodiment of the present invention.

FIG. 9A depicts cross-sectional view 900A of the semiconductor structure across gates 7 of a nanosheet transistor after forming vias 91 to a next metal layer in the nanosheet transistor, in accordance with an embodiment of the present invention. As depicted, FIG. 9A includes substrate 2, BDI 3, S/D epitaxy 4, semiconductor channel layers 5, inner spacers 6, gates 7, ILD 8, spacers 9, S/D contacts 30 with dielectric cap 51, gate contact 71A, gate jumper 71B, ILD 81, and vias 91. Vias 91 are formed in ILD 81 to connect to the next level of wiring in the semiconductor device, such as the M1 metal level.

For example, using known MOL processes, such as organic planarization layer (OPL) coating, via patterning for the via connecting to S/D contacts 30, via etching (e.g., ME) for the via connecting to S/D contact 30, OPL ash, OPL coating, via patterning for the vias connecting to gates 7, OPL ash, and via etching for the vias connecting to gates 7. In this way, the via holes for vias 91 may be formed.

In some examples, liner material (not depicted in FIG. 9A) may be deposited over the semiconductor structure of FIG. 9A. For example, using one or more of known deposition processes such as PVD, ALD, or CVD, one or more layers of conventional liner materials such as Ti, TiN, TaN, or other typical liner materials is deposited over the semiconductor structure of FIG. 9A and in the holes or trenches for forming the via connecting to S/D contacts 30. After the optional liner material deposition, the conductive via metal material or metal alloy materials such as tungsten, cobalt, molybdenum, copper, ruthenium, or a metal compound such as tungsten carbide is deposited over the semiconductor structure filling the via holes that can include a liner (not depicted in FIG. 9A).

After depositing the metal or metal alloys for vias 91, a CMP removes excess via metal from the top surface of ILD 81 to form vias 91. As depicted in FIG. 9A, one of vias 91 connects to S/D contact 30, a second of vias 91 connects to gate contact 71A, and the third, rightmost of vias 91 connects with gate jumper 71B.

The semiconductor structure depicted in FIG. 9A provides electrical isolation of S/D contact 30 from gate contact 71A and from gate jumper 71B using dielectric cap 51 that keeps either of gate contact 71A or gate jumper 71B from contacting S/D contact 30. Dielectric cap 51 on S/D contacts 30 is a feature of the nanosheet transistor that can reduce yield loss during semiconductor chip manufacture by preventing shorting of gate contact 71A and gate jumper 71B to S/D contacts 30.

Additionally, the semiconductor structure depicted in FIG. 9A provides gate jumper 71B that connects two adjacent gates 7 by using dielectric cap 51 to electrically isolate gate jumper 71B from the one of S/D contacts 30 residing between the two connected gates 7. Addition of dielectric cap 51 in the semiconductor structure of FIG. 9A both prevents shorting between S/D contacts 30 and an adjacent gate of gates 7 and allows the formation of gate jumper 71B over one of S/D contacts 30.

As depicted in FIG. 9A, gate jumper 71B provides an electrical connection between two adjacent gates 7 where a single via of vias 91 can connect both of gates 7 under and connected to gate jumper 71B to the next level of wiring (e.g., M1 metal layer) in the BEOL interconnect wiring. In some embodiments, one of vias 91 connects to gate jumper 71B (not depicted in FIG. 9A) that is formed over three dielectric caps 51 and connects four of gates 7. In this way, gate jumper 71B reduces the number vias 91 required to connect each of the four gates 7 bridged or connected by gate jumper 71B that is over three of dielectric cap 51 to the next metal layer in the semiconductor structure from four of vias 91 (e.g., each via 91 connecting to one of the four of gates 7) to one of vias 91 connecting to gate jumper 71B bridging four of gates 7.

While FIGS. 1A-9B depict semiconductor structures for a nanosheet transistor, as known to one skilled in the art, the processes, and materials depicted and discussed with reference to FIGS. 1A-9B for forming gate jumpers connecting at least two adjacent gates using a dielectric cap over a source/drain residing between each of the connected gates can be applied to other types of logic devices (e.g., planar FETs, finFETs, etc.), memory devices such as magnetoresistive random-access memory (MRAM) devices, dynamic RAM devices, etc., or other types of electronic devices.

Figure 9B:
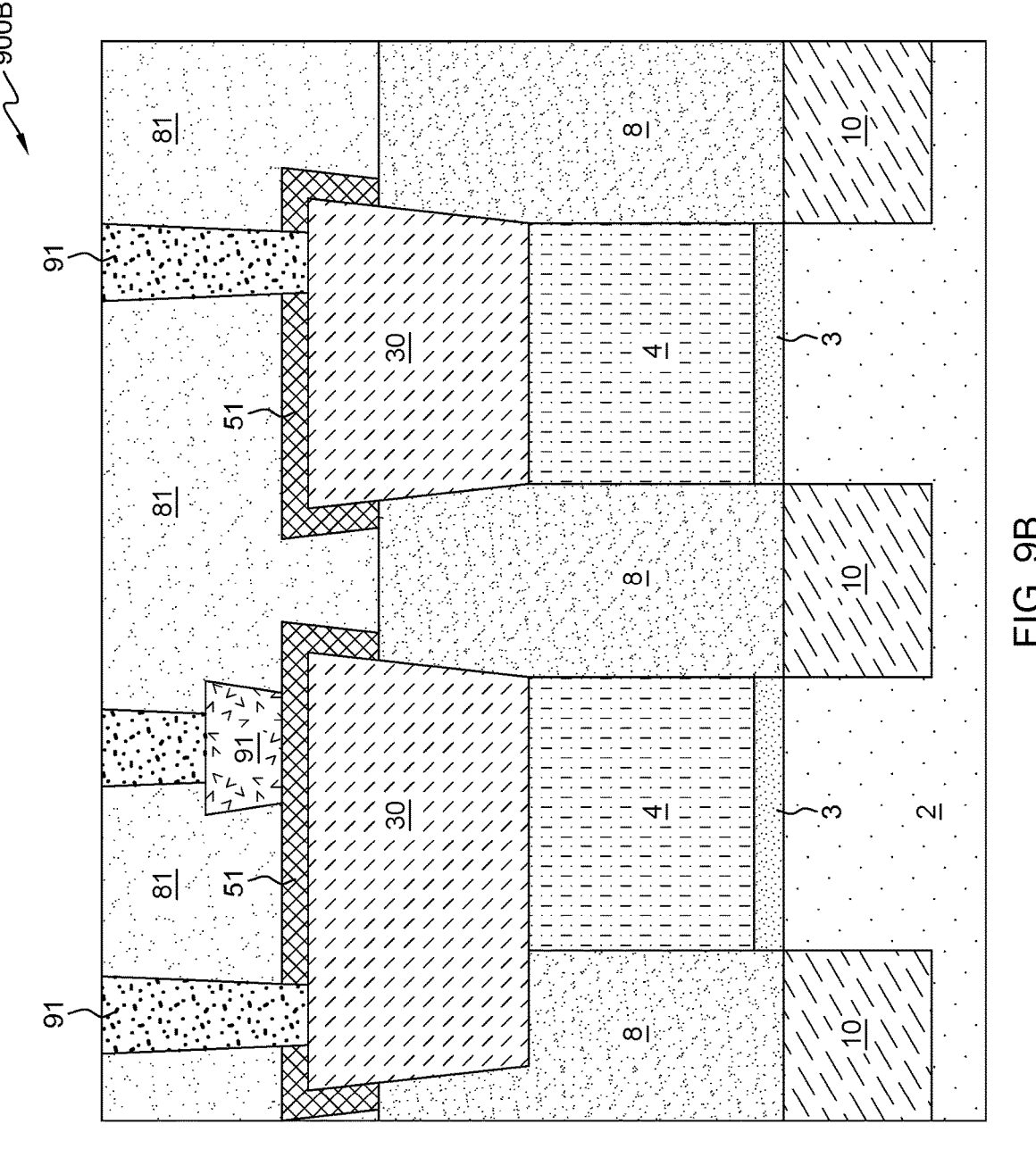
FIG. 9B depicts a cross-sectional view of the semiconductor structure a portion of the nanosheet transistor that is parallel to the gates of the nanosheet transistor in the source-drain contact region after forming vias to the next metal layer in the nanosheet transistor, in accordance with an embodiment of the present invention.

FIG. 9B depicts a cross-sectional view 900B of the semiconductor structure that is parallel to gates 7 of the nanosheet transistor after forming vias 91 to a next metal layer in the nanosheet transistor, in accordance with an embodiment of the present invention. As depicted, FIG. 9B includes substrate 2 with STI 10, BDI 3, S/D epitaxy 4, ILD 8, S/D contacts 30, dielectric cap 51, gate jumper 71B, ILD 81, and vias 91. Vias 91 connect to the next level of metal such as the M1 metal level.

Vias 91 can be formed with known MOL processes, as discussed above, for forming vias in interconnect wiring. As depicted, the leftmost of vias 91 connects to S/D contact 30, the middle via or vias 91 connects to gate jumper 71B, and the rightmost via of vias 91 connects to another of S/D contacts 30. In other examples, any number of vias 91 may be formed with various connections to the next level of metal in the semiconductor chip.

The methods, as described herein, can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor structure, the semiconductor structure comprising:

a source/drain contact for a semiconductor device;

a dielectric cap located on top of the source/drain contact and on an upper portion of sidewalls of the source/drain contact;

two gates adjacent to the source/drain contact; and a gate jumper connects the two gates adjacent to the source/drain contact, wherein the gate jumper surrounds the dielectric cap located on top of the source/drain contact and on the upper portion of the sidewalls of the source/drain contact.

2. The semiconductor structure of claim 1, further comprises:

a first layer of the interlayer dielectric material surrounding and over a portion of the gate jumper; and a via contacting a top surface of the gate jumper connecting to a next metal level of the semiconductor device.

3. The semiconductor structure of claim 1, wherein the dielectric cap electrically isolates the source/drain contact from the gate jumper.

4. The semiconductor structure of claim 2, wherein the gate jumper provides a signal path from a first gate connected by the gate jumper to a second gate when the second gate is in a congested area without a contact via.

5. A semiconductor structure, the semiconductor structure comprising:

a plurality of source/drain contacts;

a dielectric cap located on top of each of the plurality of source/drain contacts and on an upper portion of sidewalls of each of the plurality of source/drain contacts;

a plurality of gates;

at least one gate contact connecting to at least one of the plurality of gates; and at least one gate jumper connecting at least two adjacent gates of the plurality of gates.

6. The semiconductor structure of claim 5, wherein each of the plurality of source/drain contacts reside between two gates of the plurality of gates.

7. The semiconductor structure of claim 5, wherein the dielectric cap located on the upper portion of the sidewalls of each of the plurality of source/drain contacts is above a first interlayer dielectric layer surrounding a lower portion of the sidewalls of each of the plurality of source/drain contacts.

8. The semiconductor structure of claim 5, wherein the dielectric cap electrically isolates each of the plurality of source/drain contacts residing between two of the plurality of gates that are adjacent and are connected by the at least one gate jumper.

9. The semiconductor structure of claim 5, further comprising:

a first via connecting one gate jumper of the at least one gate jumper to a next metal level of the semiconductor structure;

a second via connecting to a single gate contact of one or more of the at least one gate contact to the next metal level of the semiconductor structure; and a third via connecting to one source/drain contact of one or more of the plurality of source/drain contacts to the next metal level of the semiconductor structure.

10. The semiconductor structure of claim 9, wherein the next metal level of the semiconductor structure is a M1 metal level.

11. The semiconductor structure of claim 9, wherein the first via connecting one gate jumper of the at least one gate jumpers to the next metal level of the semiconductor structure connects two gates of the plurality of gates to the next metal level of the semiconductor structure with a single via.

12. The semiconductor structure of claim 5, wherein the plurality of source/drain contacts, the dielectric cap, the plurality of gates, the at least one gate contact, and the at least one gate jumper connecting at least two adjacent gates of the plurality of gates form a portion of a logic device.

13. The semiconductor structure of claim 5, further comprises:

three source/drain contacts of the plurality of source/drain contacts;

the dielectric cap on at least a portion of each of the three source/drain contacts of the plurality of source/drain contacts;

four adjacent gates of the plurality of gates;

a gate jumper of the at least one gate jumper connecting the four adjacent gates of the plurality of gates; and one via connecting the gate jumper to a next metal level of the semiconductor structure.

14. The semiconductor structure of claim 13, wherein the gate jumper connecting the four adjacent gates reduces a number vias required to connect each of the four adjacent gates to the next metal layer in the semiconductor structure to the one via.

15. A method of forming a gate jumper in a semiconductor structure, the method comprising:

depositing a first layer of an interlayer dielectric on a plurality of gate structures and a plurality of source/drains in a portion of a semiconductor structure;

patterning and etching the first layer of the interlayer dielectric above each of the plurality of source/drains;

depositing and planarizing source/drain metal to form a source/drain contact on each of the plurality of source/drains;

selectively recessing portions of the first layer of the interlayer dielectric between each of a plurality of source/drain contacts on the plurality of source/drains;

selectively forming a dielectric cap on exposed top portions of each of the plurality of source/drain contacts;

depositing and planarizing a second layer of the interlayer dielectric on each of the dielectric caps and the first interlayer dielectric;

forming holes in the first layer of interlayer dielectric and the second layer of interlayer dielectric for one or more gate contacts and one or more gate jumpers on one or more gate structures using a self-aligning, isotropic etching process, wherein the holes for the one or more gate jumpers is etched over at least one dielectric cap on one source/drain contact of the plurality of source/drain contacts and at least two adjacent gates of a nanosheet transistor;

forming one or more of gate contacts and gate jumpers by contact metal deposition and planarization; and forming a plurality of vias, wherein each via contact one of a gate contact of the one or more of the one or more gate contacts and a gate jumper of the one or more gate jumpers.

16. The method of claim 15, wherein selectively recessing portions of the first layer of the interlayer dielectric between each of the plurality of source/drain contacts on the plurality of source/drains includes removing a top portion of the first layer of the interlayer dielectric between each of the plurality of source/drain contacts to expose a top portion of each of the plurality of source/drain contacts.

17. The method of claim 16, wherein selectively forming the dielectric cap on exposed portions of each of the plurality of source/drain contacts includes selectively forming the dielectric cap on the top portion of each of the plurality of source/drain contacts.

18. The method of claim 16, wherein selectively forming the dielectric cap on exposed portions of each of the plurality of source/drain contacts includes one of selectively oxidizing the top portion of each of the plurality of source/drains or selectively depositing a layer of a dielectric material on the top portion of each of the plurality of source/drains.

19. The method of claim 15, wherein forming holes in the first layer of interlayer dielectric and the second layer of interlayer dielectric for the one or more gate jumpers on the one or more gate structures of the plurality of gate structures, further comprises:

forming one hole over two adjacent gate structures of the plurality of gate structures, wherein a source/drain of the plurality of source/drains resides between the two adjacent gate structures, and wherein a source/drain contact is on; and the dielectric cap remains on the source/drain contact that resides between the two adjacent gate structures.

20. The method of claim 15, wherein forming the one hole over two adjacent gate structures of the plurality of gate structures, further comprises:

depositing a layer of a gate contact metal over the semiconductor structure with the one hole, performing a chemical-mechanical polish to remove excess gate contact metal, and forming the gate jumper of the one or more gate jumpers, wherein the gate jumper is over the dielectric cap remaining on the source/drain contact that resides between the two adjacent gate structures and contacts a top surface of the two adjacent gate structures.

* * * * *